US008004283B2

(12) United States Patent
Mills et al.

(10) Patent No.: US 8,004,283 B2
(45) Date of Patent: Aug. 23, 2011

(54) METHOD OF ACTUATING A TEST FUNCTION OF AN ELECTRICAL SWITCHING APPARATUS AT A PANEL AND ELECTRICAL SWITCHING APPARATUS EMPLOYING THE SAME

(75) Inventors: Patrick W. Mills, Bradenton, FL (US); Richard G. Benshoff, Sarasota, FL (US); James M. McCormick, Bradenton, FL (US)

(73) Assignee: Eaton Corporation, Cleveland, OH (US)

( * ) Notice: Subject to any disclaimer, the term of this patent is extended or adjusted under 35 U.S.C. 154(b) by 469 days.

(21) Appl. No.: 12/019,794

(22) Filed: Jan. 25, 2008

(65) Prior Publication Data

US 2009/0189612 A1 Jul. 30, 2009

(51) Int. Cl.
*G01R 31/02* (2006.01)

(52) U.S. Cl. ..................... 324/415; 335/172; 200/43.02; 200/540; 200/50.31

(58) Field of Classification Search .................. 324/415; 200/43.02, 540

See application file for complete search history.

(56) References Cited

U.S. PATENT DOCUMENTS

| | | | |
|---|---|---|---|
| 4,081,852 A | 3/1978 | Coley et al. | |
| 4,288,768 A | 9/1981 | Arnhold et al. | |
| 4,443,716 A | 4/1984 | Avery | |
| 5,224,006 A | 6/1993 | MacKenzie et al. | |
| 5,260,676 A | 11/1993 | Patel et al. | |
| 5,293,522 A | 3/1994 | Fello et al. | |
| 5,298,701 A * | 3/1994 | Sandor | 200/50.31 |
| 5,334,939 A * | 8/1994 | Yarbrough | 324/424 |
| 5,422,564 A | 6/1995 | Earle et al. | |
| 5,459,630 A | 10/1995 | MacKenzie et al. | |
| 5,691,869 A | 11/1997 | Engel et al. | |
| 5,894,116 A * | 4/1999 | Da Dalt | 200/43.04 |
| 5,969,920 A | 10/1999 | Mackenzie | |
| 5,982,593 A | 11/1999 | Kimblin et al. | |
| 6,072,317 A | 6/2000 | Mackenzie | |
| 6,084,756 A | 7/2000 | Doring et al. | |
| 6,163,144 A | 12/2000 | Steber et al. | |
| 6,215,378 B1 | 4/2001 | Gibson et al. | |
| 6,285,534 B1 | 9/2001 | Gibson et al. | |
| 6,392,513 B1 | 5/2002 | Whipple et al. | |
| 6,522,228 B2 | 2/2003 | Wellner et al. | |
| 6,522,509 B1 | 2/2003 | Engel et al. | |
| 6,542,056 B2 | 4/2003 | Nerstrom et al. | |

(Continued)

FOREIGN PATENT DOCUMENTS

EP 1045300 A2 10/2000

(Continued)

*Primary Examiner* — Timothy J Dole
*Assistant Examiner* — Benjamin M Baldridge
(74) *Attorney, Agent, or Firm* — Bradley J Diedrich; Kirk D. Houser

(57) ABSTRACT

An arc fault circuit breaker includes a panel having a first side and an opposite second side, a housing coupled to the opposite second side of the panel, separable contacts, an operating mechanism structured to open and close the separable contacts, and a trip mechanism cooperating with the operating mechanism to trip open the separable contacts. The trip mechanism includes a test circuit structured to simulate a trip condition to trip open the separable contacts, and a proximity sensor disposed on or within the housing proximate the opposite second side of the panel. The proximity sensor is structured to sense a target to actuate the test circuit when the target is disposed proximate the first side of the panel and opposite the proximity sensor.

17 Claims, 6 Drawing Sheets

U.S. PATENT DOCUMENTS

| | | | | |
|---|---|---|---|---|
| 6,710,687 | B2 | 3/2004 | Elms et al. | |
| 6,710,688 | B2 | 3/2004 | Wellner et al. | |
| 6,720,872 | B1 | 4/2004 | Engel et al. | |
| 6,734,682 | B2 | 5/2004 | Tallman et al. | |
| 6,744,260 | B2 | 6/2004 | Schmalz et al. | |
| 6,765,390 | B2 | 7/2004 | Elms | |
| 6,900,641 | B2 | 5/2005 | Draggie et al. | |
| 7,570,062 | B2 * | 8/2009 | Mills et al. | 324/415 |
| 2006/0080063 | A1 | 4/2006 | Vaughn | |
| 2006/0125582 | A1 * | 6/2006 | Mills et al. | 335/172 |
| 2006/0254893 | A1 * | 11/2006 | Mills et al. | 200/313 |
| 2007/0289852 | A1 * | 12/2007 | McCoy | 200/43.01 |

FOREIGN PATENT DOCUMENTS

| | | | |
|---|---|---|---|
| EP | 1435635 | A1 | 7/2004 |
| EP | 1670014 | A1 | 6/2006 |

* cited by examiner

METHOD OF ACTUATING A TEST FUNCTION OF AN ELECTRICAL SWITCHING APPARATUS AT A PANEL AND ELECTRICAL SWITCHING APPARATUS EMPLOYING THE SAME

BACKGROUND OF THE INVENTION

1. Field of the Invention

This invention relates to electrical switching apparatus and, more particularly, to circuit interrupters, such as, for example, aircraft or aerospace circuit breakers providing arc fault protection. The invention also relates to methods of actuating a test function of an electrical switching apparatus, such as, for example, an arc fault test of an aircraft or aerospace circuit breaker.

2. Background Information

Electrical switching apparatus include, for example, circuit switching devices; circuit interrupters, such as circuit breakers; network protectors; contactors; motor starters; motor controllers; and other load controllers.

Circuit breakers are used to protect electrical circuitry from damage due to an overcurrent condition, such as an overload condition or a relatively high level short circuit or fault condition. In small circuit breakers, commonly referred to as miniature circuit breakers, used for residential and light commercial applications, such protection is typically provided by a thermal-magnetic trip device. This trip device includes a bimetal, which heats and bends in response to a persistent overcurrent condition. The bimetal, in turn, unlatches a spring powered operating mechanism, which opens the separable contacts of the circuit breaker to interrupt current flow in the protected power system.

Subminiature circuit breakers are used, for example, in aircraft or aerospace electrical systems where they not only provide overcurrent protection but also serve as switches for turning equipment on and off. Such circuit breakers must be small to accommodate the high-density layout of circuit breaker panels, which make circuit breakers for numerous circuits accessible to a user. Aircraft electrical systems, for example, usually consist of hundreds of circuit breakers, each of which is used for a circuit protection function as well as a circuit disconnection function through a push-pull handle.

Typically, subminiature circuit breakers have provided protection against persistent overcurrents implemented by a latch triggered by a bimetal responsive to $I^2R$ heating resulting from the overcurrent. There is a growing interest in providing additional protection, and most importantly arc fault protection.

During sporadic arc fault conditions, the overload capability of the circuit breaker will not function since the root-mean-squared (RMS) value of the fault current is too small to actuate the automatic trip circuit. The addition of electronic arc fault sensing to a circuit breaker can add one of the elements required for sputtering arc fault protection—ideally, the output of an electronic arc fault sensing circuit directly trips and, thus, opens the circuit breaker. See, for example, U.S. Pat. Nos. 6,710,688; 6,542,056; 6,522,509; 6,522,228; 5,691,869; and 5,224,006.

Common methods of actuating a test function on, for example, a circuit breaker, include employing a mechanical pushbutton switch. See, for example, U.S. Pat. Nos. 5,982,593; 5,459,630; 5,293,522; 5,260,676; and 4,081,852. However, such mechanical mechanisms often fail due to mechanical stress and may be actuated by mistake. Furthermore, such mechanical mechanisms, when employed on a relatively small circuit breaker, such as, for example, a sub-miniature circuit breaker, are of relatively large size.

Proximity sensors include, for example, Hall effect sensors. These sensors, used in automatic metal detectors, change their electrical characteristics when exposed to a magnet. Usually, such sensors have three wires for supply voltage, signal and ground.

Installation of arc fault circuit breakers in panels of aircraft (e.g., without limitation, optimized panels of F-15, F-16 or F-18 combat helicopters) provides little space to test such circuit breakers using an arc fault tester. When using the arc fault tester, the panel must be opened to access the rear terminals of the arc fault circuit breaker, the load connection to the arc fault circuit breaker must be disconnected, and the arc fault tester must be manually run.

U.S. Patent Application Publication No. 2006/0125582 discloses an aircraft or aerospace arc fault circuit breaker including a Hall effect sensor disposed within a housing and proximate a rear opening thereof. A target, such as a magnetic tool or magnetic wand, is inserted within the rear opening to actuate the Hall effect sensor. When the sensor changes state, this informs a processor that a test function has been initiated. The processor, then, responsively outputs a pulse stream signal that simulates an arcing event into the input stage of an arc fault detector, which trips the circuit breaker.

Aircraft or aerospace panels, which are typically dielectrically coated, obstruct testing from the rear of such panels when attempting to insert the magnetic target within the rear housing opening of the circuit breaker to actuate the Hall effect sensor. Hence, the panel must be removed to initiate the test function. However, test personnel must exercise extreme caution since the rear line and load terminals of the circuit breaker remain energized.

There is room for improvement in electrical switching apparatus employing a test function and in methods of actuating a test function of a panel-mounted electrical switching apparatus.

SUMMARY OF THE INVENTION

These needs and others are met by the invention, which actuates a test function of an electrical switching apparatus by disposing a target proximate the first side of a panel and opposite a proximity sensor, which is disposed on or within a housing of the electrical switching apparatus and proximate the opposite second side of the panel. Then, responsive to sensing the target, the test function of the electrical switching apparatus is actuated.

In accordance with one aspect of the invention, a method actuates a test function of a circuit interrupter including a housing, the circuit interrupter being coupled to a panel having a first side and an opposite second side. The method comprises: coupling the housing to the panel at the opposite second side thereof; disposing a proximity sensor on or within the housing and proximate the opposite second side of the panel; disposing a target proximate the first side of the panel and opposite the proximity sensor; sensing the target with the proximity sensor; and responsive to the sensing the target, actuating the test function of the circuit interrupter.

The method may comprise providing an opening passing from the first side to the opposite second side of the panel; disposing a protrusion from the housing; passing the protrusion from the opposite second side of the panel, through the opening of the panel, and beyond the first side of the panel; disposing the proximity sensor completely within the housing and proximate the protrusion of the housing; and disposing the target proximate the protrusion of the housing at the first side of the panel and opposite the proximity sensor.

The method may comprise providing an opening passing from the first side to the opposite second side of the panel; disposing a threaded coupling member from the housing; passing the threaded coupling member from the opposite second side of the panel, through the opening of the panel, and beyond the first side of the panel; and coupling the housing to the panel with a threaded fastener on the threaded coupling member at the first side of the panel.

The method may comprise providing an opening passing from the first side to the opposite second side of the panel; disposing a protrusion from the housing; passing the protrusion from the opposite second side of the panel, through the opening of the panel, and beyond the first side of the panel; including an operating member with the circuit interrupter; disposing the operating member partially within the protrusion of the housing and beyond the first side of the panel; holding the target with a holding member proximate the operating member; and substantially covering the operating member with the holding member.

As another aspect of the invention, an electrical switching apparatus comprises: a panel having a first side and an opposite second side; a housing coupled to the opposite second side of the panel; separable contacts; an operating mechanism structured to open and close the separable contacts; and a trip mechanism cooperating with the operating mechanism to trip open the separable contacts, the trip mechanism comprising: a test circuit structured to simulate a trip condition to trip open the separable contacts, and a proximity sensor disposed on or within the housing proximate the opposite second side of the panel, the proximity sensor being structured to sense a target member to actuate the test circuit when the target member is disposed proximate the first side of the panel and opposite the proximity sensor.

The panel may comprise an opening passing from the first side to the opposite second side of the panel; and the housing may comprise a first threaded coupling member disposed from the housing, the first threaded coupling member passing from the opposite second side of the panel, through the opening of the panel, and beyond the first side of the panel, and may further comprise a second threaded coupling member coupling the first threaded coupling member to the panel.

The panel may comprise an opening passing from the first side to the opposite second side of the panel; the housing may comprise a first coupling member passing from the opposite second side of the panel, through the opening of the panel, and beyond the first side of the panel, and may further comprise a second coupling member coupling the first coupling member to the panel, the first coupling member having an opening therethrough; the operating mechanism may comprise an operating handle passing through the opening of the coupling member; and the target member may comprise a first portion structured to substantially surround the operating handle and the coupling member at the first side of the panel, and a second portion carried by the first portion and being structured to be sensed by the proximity sensor.

The first portion of the target member may be an insulative portion; and the second portion of the target member may be a magnetic portion.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

As employed herein, the term "number" shall mean one or an integer greater than one (i.e., a plurality).

As employed herein, the term "processor" means a programmable analog and/or digital device that can store, retrieve, and process data; a computer; a workstation; a personal computer; a microprocessor; a microcontroller; a microcomputer; a central processing unit; a mainframe computer; a mini-computer; a server; a networked processor; or any suitable processing device or apparatus.

As employed herein, the statement that two or more parts are "connected" or "coupled" together shall mean that the parts are joined together either directly or joined through one or more intermediate parts. Further, as employed herein, the statement that two or more parts are "attached" shall mean that the parts are joined together directly.

The invention is described in association with a panel-mounted aircraft or aerospace arc fault circuit breaker, although the invention is applicable to a wide range of electrical switching apparatus at a panel, such as, for example and without limitation, circuit interrupters structured to detect a wide range of faults, such as, for example, arc faults or ground faults in power circuits.

Figure 1:
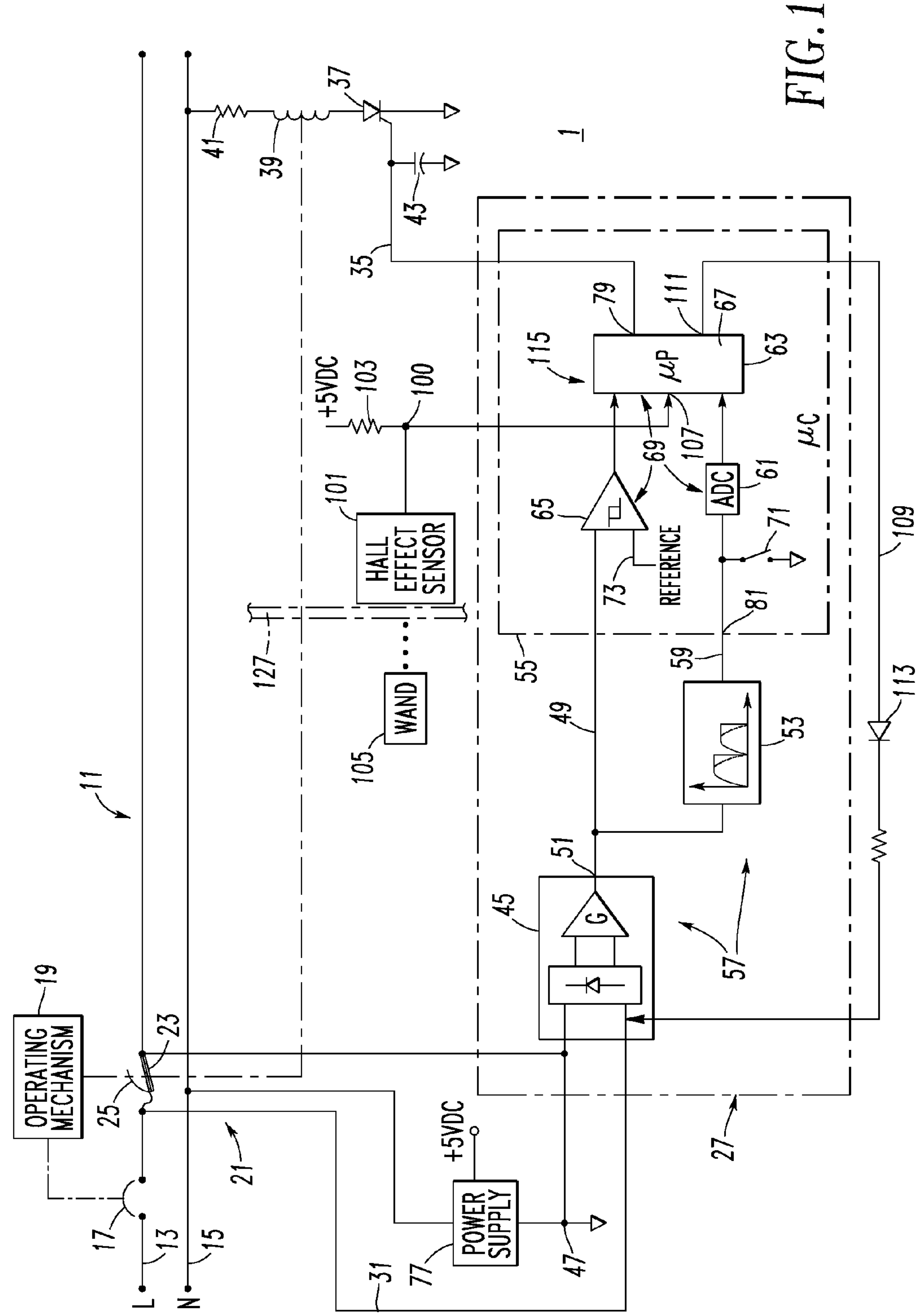
FIG. 1 is a block diagram of a circuit breaker including a Hall effect sensor to actuate an arc fault test function in accordance with embodiments of the invention.

Referring to FIG. 1, an arc fault circuit breaker 1 is connected in an electric power system 11 which has a line conductor (L) 13 and a neutral conductor (N) 15. The circuit breaker 1 includes separable contacts 17 which are electrically connected in the line conductor 13. The separable contacts 17 are opened and closed by an operating mechanism 19. In addition to being operated manually by a handle (not shown) (but see the operating handle 143 of FIGS. 3-8), the operating mechanism 19 can also be actuated to open the separable contacts 17 by a trip assembly 21. This trip assembly 21 includes the conventional bimetal 23 which is heated by persistent overcurrents and bends to actuate the operating mechanism 19 to open the separable contacts 17. An armature 25 in the trip assembly 21 is attracted by the large magnetic force generated by very high overcurrents to also actuate the operating mechanism 19 and provide an instantaneous trip function.

The circuit breaker 1 is also provided with an arc fault detector (AFD) 27. The AFD 27 senses the current in the electrical system 11 by monitoring the voltage across the bimetal 23 through the lead 31 with respect to local ground reference 47. If the AFD 27 detects an arc fault in the electric power system 11, then a trip signal 35 is generated which turns on a switch such as the silicon controlled rectifier (SCR) 37 to energize a trip solenoid 39. The trip solenoid 39 when energized actuates the operating mechanism 19 to open the separable contacts 17. A resistor 41 in series with the coil of the solenoid 39 limits the coil current and a capacitor 43 protects the gate of the SCR 37 from voltage spikes and false tripping due to noise. Alternatively, the resistor 41 need not be employed.

The AFD 27 cooperates with the operating mechanism 19 to trip open the separable contacts 17 in response to an arc fault condition. The AFD 27 includes an active rectifier and gain stage 45, which rectifies and suitably amplifies the voltage across the bimetal 23 through the lead 31 and the local ground reference 47. The active rectifier and gain stage 45 outputs a rectified signal 49 on output 51 representative of the current in the bimetal 23. The rectified signal 49 is input by a peak detector circuit 53 and a microcontroller (μC) 55.

The active rectifier and gain stage 45 and the peak detector circuit 53 form a first circuit 57 structured to determine a peak amplitude 59 of a rectified alternating current pulse based upon the current flowing in the electric power system 11. The peak amplitude 59 is stored by the peak detector circuit 53.

The μC 55 includes an analog-to-digital converter (ADC) 61, a microprocessor (μP) 63 and a comparator 65. The μP 63 includes one or more arc fault algorithms 67. The ADC 61 converts the analog peak amplitude 59 of the rectified alternating current pulse to a corresponding digital value for input by the μP 63. The μP 63, arc fault algorithm(s) 67 and ADC 61 form a second circuit 69 structured to determine whether the peak amplitude of the current pulse is greater than a predetermined magnitude. In turn, the algorithm(s) 67 responsively employ the peak amplitude to determine whether an arc fault condition exists in the electric power system 11.

The μP 63 includes an output 71 structured to reset the peak detector circuit 59. The second circuit 69 also includes the comparator 65 to determine a change of state (or a negative (i.e., negative-going) zero crossing) of the alternating current pulse of the current flowing in the electric power system 11 based upon the rectified signal 49 transitioning from above or below (or from above to below) a suitable reference 73 (e.g., a suitable positive value of slightly greater than zero). Responsive to this negative zero crossing, as determined by the comparator 65, the μP 63 causes the ADC 61 to convert the peak amplitude 59 to a corresponding digital value.

The example arc fault detection method employed by the AFD 27 is "event-driven" in that it is inactive (e.g., dormant) until a current pulse occurs as detected by the comparator 65. When such a current pulse occurs, the algorithm(s) 67 record the peak amplitude 59 of the current pulse as determined by the peak detector circuit 53 and the ADC 61, along with the time since the last current pulse occurred as measured by a timer (not shown) associated with the μP 63. The arc fault detection method then uses the algorithm(s) 67 to process the current amplitude and time information to determine whether a hazardous arc fault condition exists. Although an example AFD method and circuit are shown, the invention is applicable to a wide range of AFD methods and circuits. See, for example and without limitation, U.S. Pat. Nos. 6,710,688; 6,542,056; 6,522,509; 6,522,228; 5,691,869; and 5,224,006.

An output 100 of a suitable proximity sensor, such as, for example and without limitation, a Hall effect sensor 101, is held "high" by a pull-up resistor 103. When the Hall effect sensor 101 is actuated, for example, by a suitable target, such as for example and without limitation, a magnetic wand 105, the sensor output 100 is driven low (e.g., by an open drain output). When the μP 63 determines that the input 107 is low, it outputs a suitable pulse train signal 109 on output 111. That signal 109 is fed back into the input of the active rectifier and gain stage 45. In turn, the pulse train signal 109 causes the AFD algorithms 67 to determine that there is an arc fault trip condition, albeit a test condition, such that the trip signal 35 is set. A blocking diode 113 is employed to prevent any current from flowing into the μP output 111.

Figure 2:
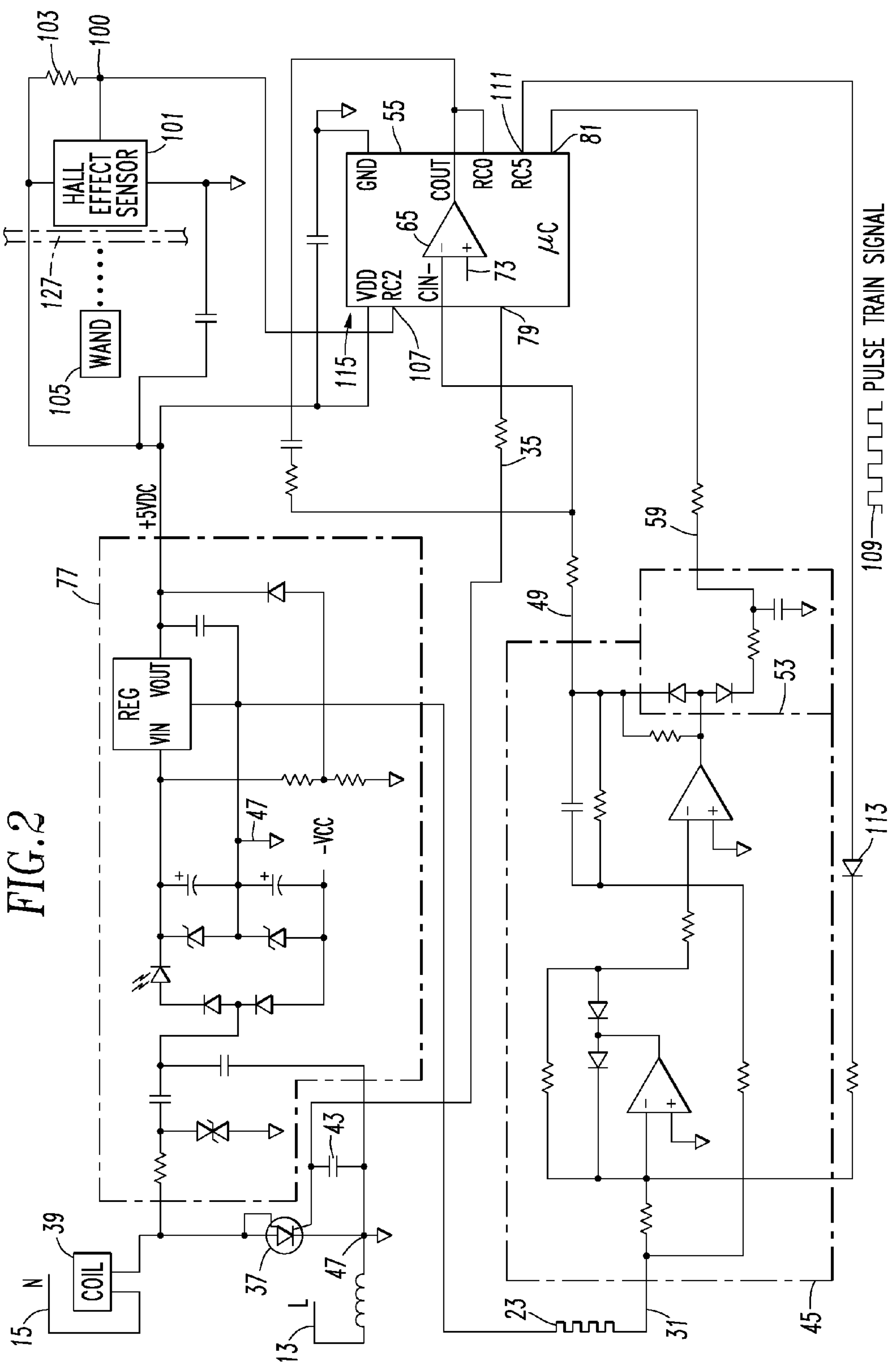
FIG. 2 is a block diagram in schematic form of the processor, power supply, active rectifier and gain stage, peak detector and Hall effect sensor of FIG. 1.

FIG. 2 is a block diagram in schematic form of the μC 55, power supply 77, active rectifier and gain stage 45, peak detector 53 and Hall effect sensor 101 of FIG. 1. The μC 55 may be, for example, a suitable processor, such as model PIC 16F676 marketed by Microchip Technology Inc. of Chandler, Ariz. A digital output 79 includes the trip signal 35. An analog input 81 receives the peak amplitude 59 for the ADC 61 (FIG. 1). Digital input RC0 of μC 55 is employed to read the output (COUT) of the comparator 65. Another digital input RC2 107 of μC 55 is employed to read the sensor output 100. Another digital output RC5 111 of μC 55 includes the pulse train signal 109 to simulate an arc fault trip condition responsive to the sensing the magnetic wand 105 with the sensor 101. The μC 55, thus, forms an arc fault trip mechanism including a test circuit 115 structured to simulate an arc fault trip condition to trip open the separable contacts 17 (FIG. 1).

Figure 3:
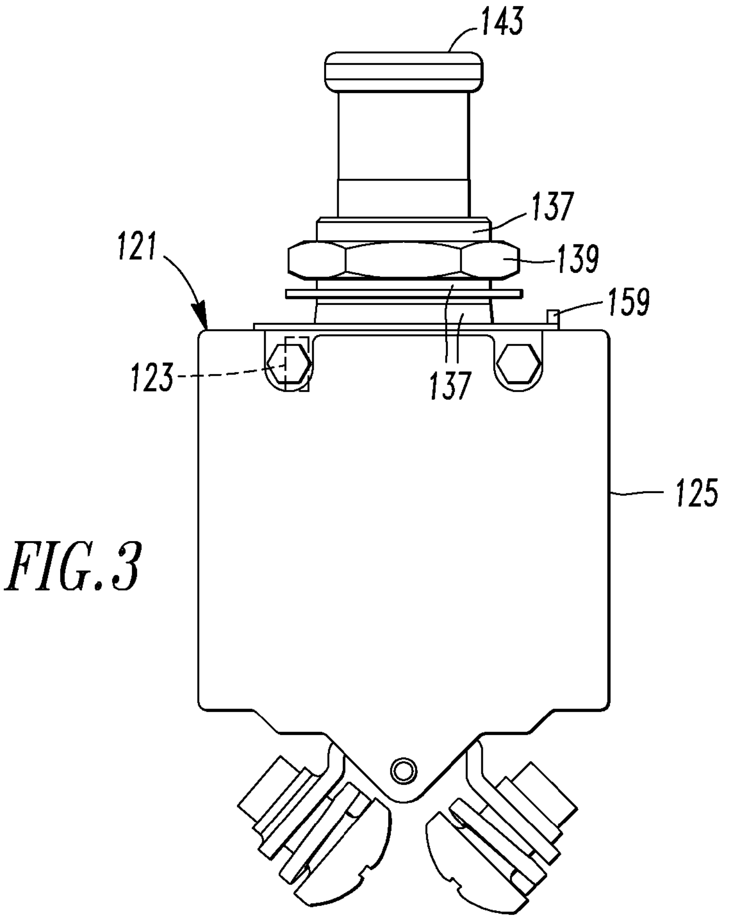
FIG. 3 is a vertical elevation view of an aircraft or aerospace circuit breaker including a Hall effect sensor in accordance with another embodiment of the invention.
Figure 4:
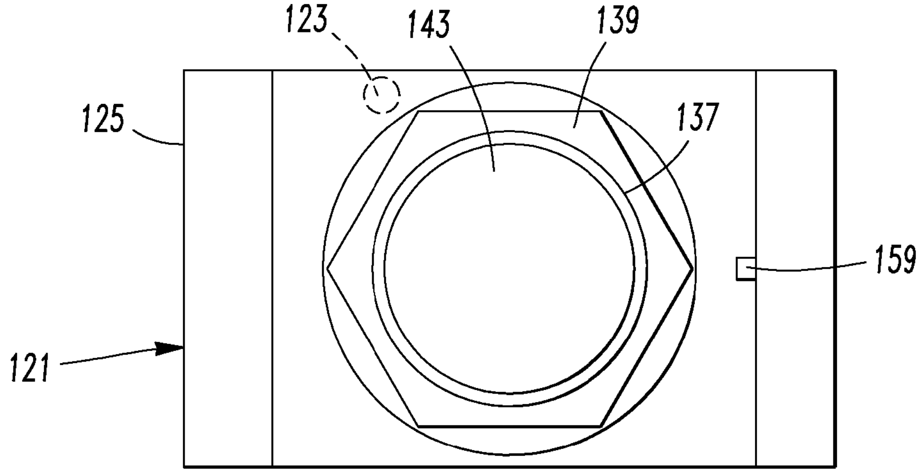
FIG. 4 is a top plan view of the aircraft or aerospace circuit breaker of FIG. 3.

FIGS. 3 and 4 show an aircraft or aerospace circuit breaker 121, which may be the same as or similar to the circuit breaker 1 of FIG. 1. A proximity sensor, such as the example Hall effect sensor 123 (shown in hidden line drawing), which may be the same as or similar to the sensor 101 of FIG. 1, is disposed within a housing 125.

Referring to FIGS. 5-8, the aircraft or aerospace circuit breaker 121 is mounted on an aircraft or aerospace panel 127. The example panel 127 has a first side 129 and an opposite second side 131. The housing 125 is coupled to the opposite second side 131 of the panel 127. The example Hall effect sensor 123 (shown in hidden line drawing in FIGS. 5 and 7) is disposed within the housing 125 proximate the opposite second side 131 of the panel 127. As will be discussed, the sensor 123 is structured to sense a target 133 (shown in hidden line drawing in FIGS. 5, 7 and 8) to actuate the test circuit 115 (FIGS. 1 and 2) and the corresponding arc fault test function when the target 133 is disposed proximate the first side 129 of the panel 127 and opposite the sensor 123.

Alternatively, in the aircraft or aerospace circuit breaker 121', which is similar to the circuit breaker 121, the example Hall effect sensor 123' (shown in hidden line drawing in FIG. 5) is disposed on the surface of the housing 125 proximate the opposite second side 131 of the panel 127.

Figure 5:
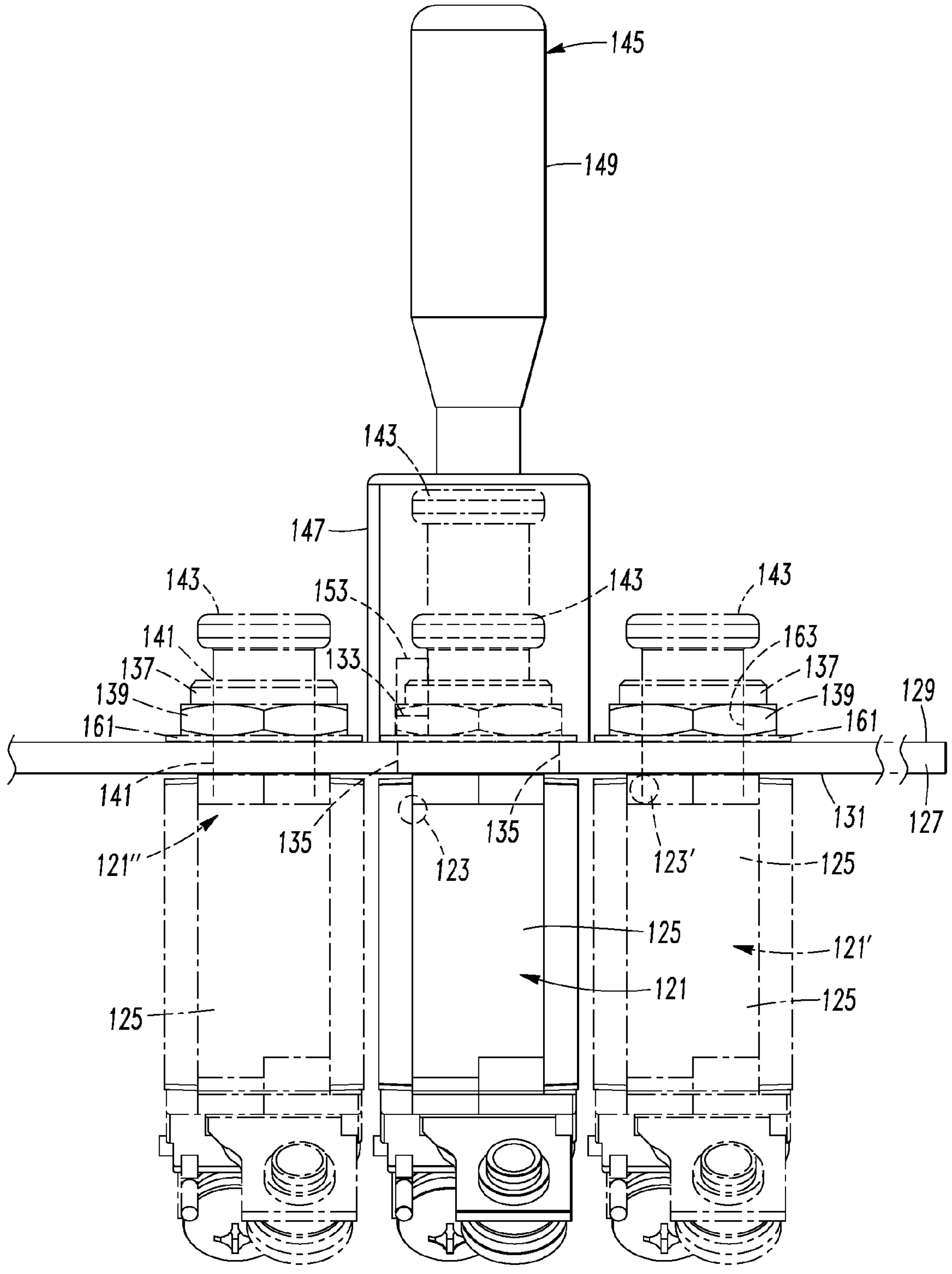
FIG. 5 is a vertical elevation view of an aircraft or aerospace circuit breaker panel including three circuit breakers and a target holding member in accordance with another embodiment of the invention.

As shown in FIG. 5, the panel 127 includes an opening 135 (shown in hidden line drawing) passing from the first side 129 to the opposite second side 131 of the panel 127. The housing 125 includes a protrusion, such as the example first threaded coupling member 137 (e.g., bezel) (also shown in FIG. 3), disposed from the housing 125. The coupling member 137 passes from the opposite second side 131 of the panel 127, through the panel opening 135, and beyond the first side 129 of the panel 127. A second threaded coupling member, such as a threaded fastener, such as the example nut 139 (also shown in FIG. 3) at the first side 129 of the panel 127, couples the first threaded coupling member 137 to the panel 127. This couples the housing 125 to the panel 127 at the opposite second side 131 thereof.

Figure 7:
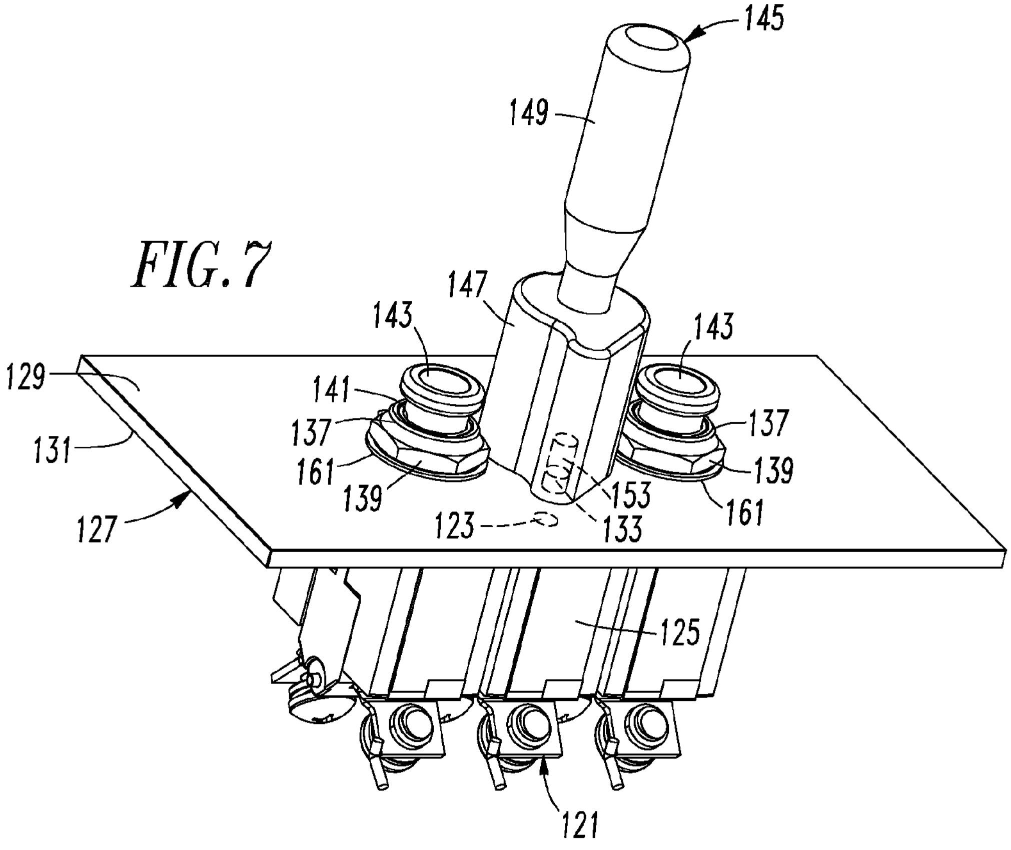

As best shown in FIGS. 5 and 7, the first threaded coupling member 137 has an opening 141 (shown in hidden line drawing in FIG. 5) therethrough. The operating mechanism 19 (FIG. 1) includes an operating member, such as the example operating handle 143, passing through the opening 141. The operating handle 143 is disposed partially within the first threaded coupling member 137 and beyond the first side 129 of the panel 127. A target member, such as a target holding member 145, includes a first insulative portion 147 structured to substantially surround the operating handle 143 and the first threaded coupling member 137 at the first side 129 of the panel 127, a second portion, which is the target 133 (shown in hidden line drawing), carried by the first insulative portion 147 and structured to be sensed by the sensor 123, and a handle portion 149. The example sensor 123 (shown in hidden line drawing) is disposed completely within the housing 125 and proximate the first threaded coupling member 137 thereof. The target 133 is proximate the first threaded coupling member 137 at the first side 129 of the panel 127 and opposite the sensor 123.

Figure 8:
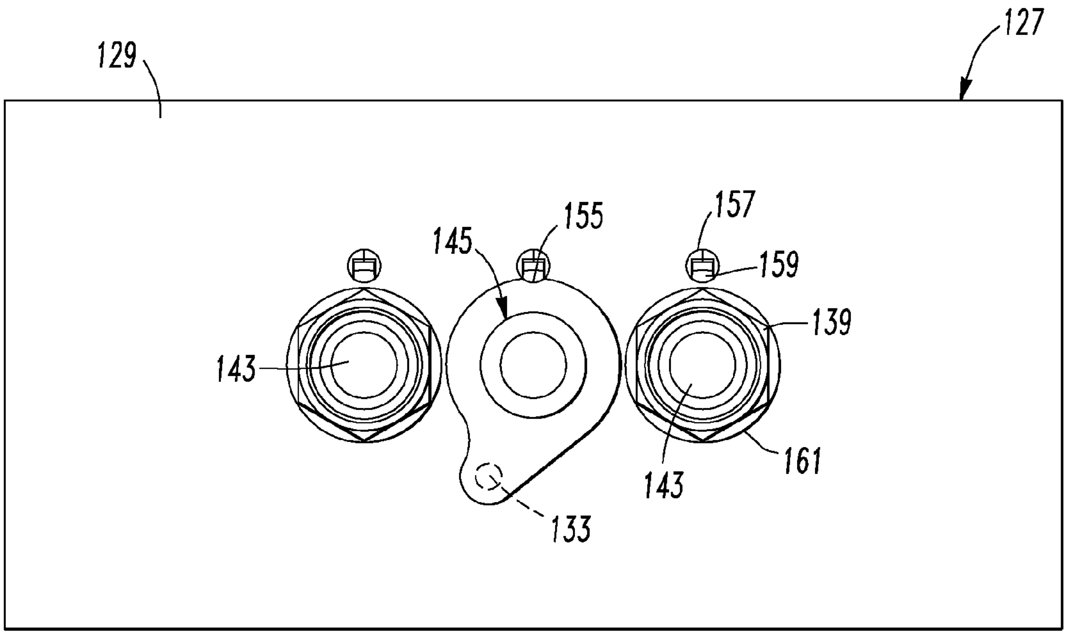
FIG. 8 is a top plan view of the aircraft or aerospace circuit breaker panel, three circuit breakers and target holding member of FIG. 5.

As shown in FIGS. 5, 7 and 8, the target 133 is held by the first insulative portion 147 proximate the operating handle 143 (shown in hidden line drawing in a "closed" position of the circuit breaker 121 and shown in phantom line drawing in an "open" position of the circuit breaker 121). The first insulative portion 147 preferably at least substantially covers the operating handle 143. The first insulative portion 147 holds a magnetic inner second portion that is the target 133.

In FIGS. 5-8, the target holding member 145 and the target 133 are positioned to actuate the Hall effect sensor 123 of FIGS. 3-5 and 7, in order to output the pulse train signal 109 of FIG. 2. The target 133 is disposed within a cylindrical opening 153 (shown in hidden line drawing in FIGS. 5 and 7) of the target holding member 145.

Figure 6:
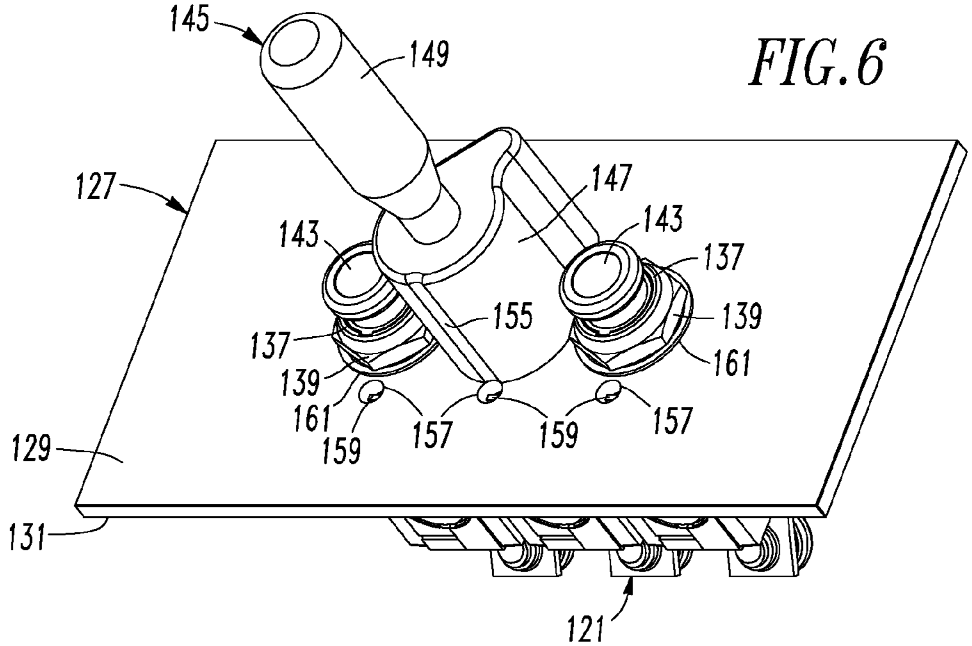
FIGS. 6 and 7 are isometric views of the aircraft or aerospace circuit breaker panel, three circuit breakers and target holding member of FIG. 5.

As shown in FIGS. 6 and 8, a user (not shown) mechanically aligns the target holding member 145, which is guided by the bezel 137 and stops at the circuit breaker alignment tab 159 or, alternatively, visually aligns the target holding member 145 by using the notch 155 thereof and the panel opening 157 for the circuit breaker alignment tab 159 (best shown in FIG. 3). Preferably, the target holding member 145 is dimensionally constrained by the circuit breaker alignment tab 159 and the bezel 137 to limit its rotational movement about the bezel 137, thereby preventing the target 133 from actuating the sensor 123 of one of the two example adjacent circuit breakers 121',121 " in the position of FIG. 8.

The panel 127 is preferably made of a non-ferrous material, such as aluminum or a suitable plastic. The sensor 123 and the target 133 are proximate (e.g., suitably near) the bezel 137, which is preferably made of brass. The example magnetic target 133 changes the field direction of the example Hall effect sensor 123, which actuates the arc fault test circuit 115. The example steel nut 139, steel washer 161 and the internal circuit breaker operating mechanism 19 (shown in block form in FIG. 1) do not affect the sensor 123 since, for example, as was discussed above, a relatively extremely strong magnet, such as the example target 133, is employed to actuate the example sensor 123.

The opening 163 in the target holding member 145 can accommodate both the closed (shown in hidden line drawing in FIG. 5) and open (shown in phantom line drawing in FIG. 5) positions of the operating handle 143. Alternatively, if the example circuit breaker 121 can trip independent of movement of the operating handle 143, then the opening 163 in the target holding member 145 need only accommodate the closed (shown in hidden line drawing in FIG. 5) position of the operating handle 143.

The invention provides a relatively easy way to test the trip electronics to verify the reliability of the circuit breakers 1,121,121',121". The target holding member 145 with the magnetic target 133 is positioned to actuate the Hall effect sensor 123 of FIGS. 3-5 and 7, or the sensor 123' of FIG. 5. The concentrated magnetic field over the Hall effect sensors 101,123,123' changes the state of the sensor output 100 (FIG. 1), which is electrically connected to the input 107 of the processor 63. When the sensor changes state, the input into the processor 63 changes, thereby informing such processor that the arc fault test function has been initiated. The processor 63, then, responsively outputs the pulse stream signal 109 that simulates an arcing event into the input stage of the AFD 27 that trips the arc fault circuit breaker 1.

Although a Hall effect digital sensor 101 is disclosed, any suitable proximity sensor may be employed. For example, an analog Hall effect sensor (not shown) may be employed, albeit with additional circuitry (not shown), in order to provide a suitable digital output, such as 100. As a further alternative to analog Hall effect sensors, a suitable magneto-resistive device (not shown) or a NAMUR inductive proximity sensor (not shown) (e.g., marketed by Turck, Inc. of Minneapolis, Minn.; Pepperl & Fuchs of Twinsburg, Ohio) may also be employed. Alternatively, a wide range of inductive proximity sensors (not shown) may be employed.

Although an arc fault test function is disclosed, any suitable test function, such as, for example and without limitation, a ground fault test function or any other suitable test function of an electrical switching apparatus may be employed.

Although an example AFD 27 is shown, it will be appreciated that a combination of one or more of analog, digital and/or processor-based circuits may be employed.

The disclosed Hall effect sensors 101,123,123' initiate a built-in test function of an electrical switching apparatus. These sensors reduce failure rate, improve reliability and employ a suitable tool, such as a magnetic wand 105 or target holding member 145, to actuate the corresponding sensor and, thus, the corresponding test function.

Although separable contacts 17 are disclosed, suitable solid state separable contacts may be employed. For example, the disclosed circuit breaker 1 includes a suitable circuit interrupter mechanism, such as the separable contacts 17 that are opened and closed by the operating mechanism 19, although the invention is applicable to a wide range of circuit interruption mechanisms (e.g., without limitation, solid state or FET switches; contactor contacts) and/or solid state based control/protection devices (e.g., without limitation, drives; soft-starters).

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the claims appended and any and all equivalents thereof.

What is claimed is:

1. A method of actuating a test function of a first circuit interrupter including a housing, a first side and an opposite second side, said first circuit interrupter being coupled to a panel having a first side and an opposite second side, said first circuit interrupter being coupled to said panel intermediate a second circuit interrupter adjacent the first side of said first circuit interrupter, and a third circuit interrupter adjacent the opposite second side of said first circuit interrupter, said method comprising:

coupling said housing to said panel at the opposite second side thereof;

disposing a proximity sensor on or within said housing and proximate the opposite second side of said panel;

disposing a target in a holding member proximate the first side of said panel and opposite said proximity sensor;

providing first and second openings passing from the first side to the opposite second side of said panel;

disposing a protrusion and an alignment member from said housing;

passing said protrusion from the opposite second side of said panel, through the first opening of said panel, and beyond the first side of said panel;

passing said alignment member from the opposite second side of said panel and through the second opening of said panel;

disposing said proximity sensor proximate the protrusion of said housing;

disposing said target in said holding member proximate the protrusion of said housing at the first side of said panel and opposite said proximity sensor;

limiting rotational movement of said holding member about said protrusion by said alignment member and said protrusion, and thereby preventing said target disposed in said holding member from actuating a corresponding test function of either of said second and third circuit interrupters;

sensing said target with said proximity sensor; and responsive to said sensing said target, actuating said test function of said first circuit interrupter without said target actuating the corresponding test function of either of said second and third circuit interrupters.

2. The method of claim 1 further comprising disposing said proximity sensor completely within said housing.

3. The method of claim 2 further comprising employing as the protrusion of said housing a bezel.

4. The method of claim 1 further comprising disposing a threaded coupling member from said housing;

passing said threaded coupling member from the opposite second side of said panel, through the first opening of said panel, and beyond the first side of said panel; and coupling said housing to said panel with a threaded fastener on the threaded coupling member at the first side of said panel.

5. The method of claim 1 further comprising including an operating handle with said first circuit interrupter;

disposing said operating handle partially within the protrusion of said housing and beyond the first side of said panel;

holding said target in said holding member proximate said operating handle; and substantially covering said operating handle with said holding member.

6. The method of claim 1 further comprising employing as said target a magnetic target.

7. The method of claim 1 further comprising including an arc fault trip mechanism with said first circuit interrupter; and outputting a pulse train signal to simulate an arc fault trip condition responsive to said sensing said target with said proximity sensor.

8. The method of claim 1 further comprising employing as said proximity sensor a Hall effect sensor.

9. The method of claim 1 further comprising employing as said first circuit interrupter a circuit breaker including separable contacts;

including with said circuit breaker a trip mechanism having a test circuit structured to simulate a trip condition to trip open said separable contacts; and outputting a signal to simulate the trip condition and trip open said separable contacts responsive to said sensing said target with said proximity sensor.

10. The method of claim 9 further comprising employing as said trip mechanism an arc fault trip mechanism; and outputting a pulse train signal to simulate an arc fault trip condition responsive to said sensing said target with said proximity sensor.

11. The method of claim 1 further comprising including an operating handle having a longitudinal axis with said first circuit interrupter;

extending said operating handle a first radius from said longitudinal axis;

employing said holding member having a longitudinal axis, a first portion extending a second radius from the longitudinal axis of said holding member, and a second portion extending a third radius from the longitudinal axis of said holding member, said second radius being greater than said first radius, said third radius being greater than said second radius;

disposing said operating handle partially within said protrusion and beyond the first side of said panel;

holding said target member in said holding member within said second portion;

substantially covering said operating handle with the first portion of said holding member; and holding said target member with the second portion of said holding member beyond said second radius.

12. A system comprising:

a target member disposed in a holding member;

a panel having a first side, an opposite second side, and first and second openings passing from the first side to the opposite second side of said panel; and three electrical switching apparatus, a first one of said three electrical switching apparatus comprising:

a housing coupled to the opposite second side of said panel, said housing including a first side, an opposite second side, and a protrusion and an alignment member disposed from said housing, said protrusion passing from the opposite second side of said panel, through the first opening of said panel, and beyond the first side of said panel, said alignment member passing from the opposite second side of said panel and through the second opening of said panel, separable contacts, an operating mechanism structured to open and close said separable contacts, and a trip mechanism cooperating with said operating mechanism to trip open said separable contacts, said trip mechanism comprising:

a test circuit structured to simulate a trip condition to trip open said separable contacts, and a proximity sensor disposed on or within said housing proximate the opposite second side of said panel and proximate the protrusion of said housing, said proximity sensor being structured to sense said target member to actuate said test circuit without said target member actuating a corresponding test function of either of a second one and a third one of said three electrical switching apparatus when said target member disposed in said holding member is disposed proximate the protrusion of said housing at the first side of said panel and opposite said proximity sensor, wherein said first one of said three electrical switching apparatus is coupled to said panel intermediate said second one of said three electrical switching apparatus adjacent the first side of said housing of said first one of said three electrical switching apparatus, and said third one of said three electrical switching apparatus adjacent the opposite second side of said housing of said first one of said three electrical switching apparatus, and wherein said alignment member and said protrusion limit rotational movement of said holding member about said protrusion, and thereby prevent said target member disposed in said holding member from actuating the corresponding test function of either of said second one and said third one of said three electrical switching apparatus.

13. The system of claim 12 wherein said housing comprises a first coupling member passing from the opposite second side of said panel, through the first opening of said panel, and beyond the first side of said panel, and further comprises a second coupling member coupling said first coupling member to said panel, said first coupling member having an opening therethrough; wherein said operating mechanism comprises an operating handle passing through the opening of said first coupling member; and wherein said target member comprises a first portion structured to substantially surround said operating handle and said first coupling member at the first side of said panel, and a second portion carried by said first portion and being structured to be sensed by said proximity sensor.

14. The system of claim 13 wherein the first portion of said target member is an insulative portion; and wherein the second portion of said target member is a magnetic portion.

15. The system of claim 12 wherein said proximity sensor is a Hall effect sensor.

16. The system of claim 12 wherein said target member includes a magnetic target.

17. The system of claim 12 wherein said operating mechanism comprises an operating handle having a longitudinal axis, said operating handle extending a first radius from said longitudinal axis; wherein said holding member has a longitudinal axis, a first portion extending a second radius from the longitudinal axis of said holding member, and a second portion extending a third radius from the longitudinal axis of said holding member, said second radius being greater than said first radius, said third radius being greater than said second radius; wherein said operating handle is partially disposed within said protrusion and beyond the first side of said panel; wherein said target member is held in said holding member within said second portion; wherein the first portion of said holding member substantially covers said operating handle; and wherein the second portion of said holding member holds said target member beyond said second radius.

* * * * *